United States Patent [19]
Cho

[11] Patent Number: 5,111,434
[45] Date of Patent: May 5, 1992

[54] SEMICONDUCTOR MEMORY DEVICE
[75] Inventor: Soon-In Cho, Seoul, Rep. of Korea
[73] Assignee: Ltd. SamSung Electronics Co., Suwon, Rep. of Korea
[21] Appl. No.: 359,128
[22] Filed: May 31, 1989
[30] Foreign Application Priority Data
   Dec. 20, 1988 [KR] Rep. of Korea ............ 1988-17050
[51] Int. Cl.⁵ .................................... G11C 11/40
[52] U.S. Cl. .................... 365/207; 365/203; 365/230.09
[58] Field of Search ............ 365/230.09, 203, 207, 365/189.04, 51

[56] References Cited
   U.S. PATENT DOCUMENTS
   4,916,667 4/1990 Miyabayashi et al. ....... 365/189.04

Primary Examiner—Terrell W. Fears
Attorney, Agent, or Firm—Robert E. Bushnell

[57] ABSTRACT

A semiconductor DRAM comprising a circuit arrangement in which an undesirable effect due to the coupling capacitance between bit lines thereof can be reduced, comprises: a plurality of bit lines arranged parallel to each other; a plurality of word lines intersecting each plurality of bit lines; a plurality of upper sense amplifiers respectively connected to uppermost ends of each of odd numbered bit line pairs; a plurality of lower sense amplifiers respectively connected to lowermost ends of each of even numbered bit line pairs; a memory cell array having a plurality of memory cells arranged sequentially in a diagonal line within selected locations of a plurality of spacings formed by intersection of the bit lines and word lines, the memory cell being disposed at every fourth spacing in a row and a column; first latching means for activating said upper sense amplifiers, the latching means being connected with said upper sense amplifiers; and second latching means coupled with said lower sense amplifiers, said first latching means and said second latching means being alternately activated to each other.

14 Claims, 3 Drawing Sheets (PRIOR ART)
FIG. 1

SEMICONDUCTOR MEMORY DEVICE

TECHNICAL BACKGROUND

The present invention concerns a Dynamic Random Access Memory (DRAM), and particularly, a circuit arrangement of bit lines therein.

Generally, a DRAM comprises a plurality of bit lines of a same length arranged in parallel with each other, and a plurality of flip-flop sense amplifiers connected with each of the bit line pairs. The memory cell comprises one transistor and one capacitor. Between each bit line and each word line is connected a memory cell, so that all the connected memory cells are arranged in a matrix of rows and columns. The circuit arrangement of the bit line pairs and the sense amplifiers conventionally appears in two forms. Namely, one form is called an open bit line arrangement wherein each of the sense amplifiers is disposed at the center of each bit line pair, while the other is called a folded bit line arrangement wherein each of the sense amplifiers is disposed at one end of each bit line pair. However, considering the equilibrium of the bit lines and the high density circuit arrangement of the memory cells, the folded bit line method is mainly used. Nowadays, as the memory cells in the DRAM are highly integrated, the space between the bit lines becomes narrower and the storage capacitor of the memory cells also becomes smaller. Hence, when a memory cell is accessed and a sense amplifier operates in corresponding to the bit line connected with the memory cell accessed, the mutual coupling capacitance between the bit line and its upper and lower adjacent bit lines may affect its normal operation.

Figure 1:
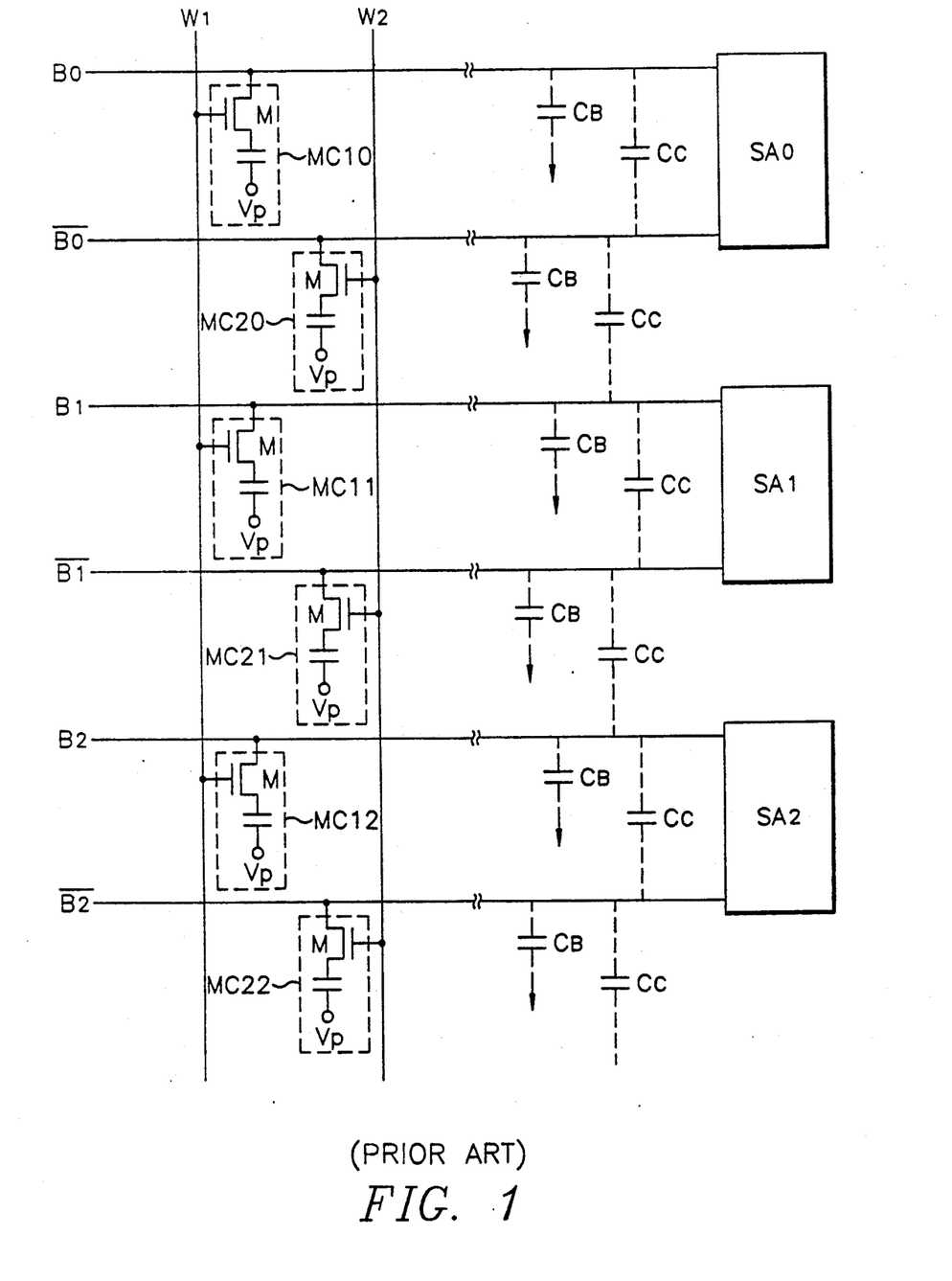
FIG. 1 illustrates the circuit of a conventional DRAM.

For example, FIG. 1 exemplifies a conventional folded bit line circuit arrangement. The memory cells MC10-MC12 and MC20-MC22 are connected with the intersection points of the bit lines B0-B2 and $\overline{B0}$-$\overline{B2}$ and the word lines W1 and W2, and each of the bit line pairs $\overline{B0}$—B0, B1—$\overline{B1}$ and B2—$\overline{B2}$ is connected, at each end, with corresponding one of the sense amplifiers SA0--SA2. Each of the memory cells MC10-MC12 and MC20-MC22 comprises a MOS transistor M and a storage capacitor C connected in series with the drain-source path of the transistor. Each of the drains of the MOS transistors is connected with one of the bit lines B0, $\overline{B0}$, ... B2 and $\overline{B2}$, while each gate of the memory cells MC10-MC12 and MC20-MC22 is connected with one of the word lines W1 and W2. The other end of the storage capacitor is connected with a constant voltage Vp. It is assumed that the parasitic capacitance of each bit line is CB, the mutual coupling capacitance between the adjacent bit lines is CC, and the capacitance of the storage capacitor C is CS.

If the memory cells MC10-MC12 are chosen by the word line signal applied to the word line W1, electric charges stored into the storage capacitors of the memory cells are respectively transferred through the corresponding MOS the bit lines B0-B2, so that the voltage of each of the bit lines B0-B2 becomes higher or lower by the amount of $$\Delta VS = \frac{(VS - VBL)CS}{CB + 2CC + CS}$$

than the voltage of each of the other bit lines $\overline{B0}$-$\overline{B2}$, wherein VS is the voltage of the storage capacitor, and VBL is the bit line voltage prior to selecting the memory cell. If the memory cells MC10-MC12 cause the bit lines B0-B2 to have the voltage higher by $\Delta VS$ than the voltage of the bit lines $\overline{B0}$-$\overline{B2}$, the sense amplifiers SA0-SA2 are activated so that the voltage of the bit lines $\overline{B0}$, $\overline{B1}$ and $\overline{B2}$ having a low voltage of VS is lowered. Hence, the voltage of the bit line B1 is lowered due to the influence of the coupling capacitance CC resulting from the lowering of voltages of the adjacent bit lines $\overline{B0}$ and $\overline{B1}$. Such an adverse effect increases as narrowing of the space between the bit lines, resulting from increasing of the memory density. Further, if the capacity of the memory cell is reduced, the sense amplifier is liable to malfunction due to the coupling capacitance.

SUMMARY OF THE INVENTION

The object of the present invention is to provide a circuit arrangement whereby undesirable effect due to the coupling capacitance between bit lines can be reduced even in the high density memory capacity.

According to one aspect of the present invention, a semiconductor DRAM comprises:
- a plurality of bit lines arranged parallel to each other;
- a plurality of word lines intersecting said plurality of bit lines;
- a plurality of upper sense amplifiers respectively connected to uppermost ends of each of odd numbered bit line pairs;
- a plurality of lower sense amplifiers respectively connected to lowermost ends of each of even numbered bit line pairs;
- a memory cell array having a plurality of memory cells arranged sequentially in a diagonal line within selected locations of a plurality of spacings formed by intersection of said bit lines and word lines, said memory cell being disposed at every fourth spacing in a row and a column;
- first latching means for activating said upper sense amplifiers, said latching means being connected with said upper sense amplifiers; and
- second latching means coupled with said lower sense amplifiers, said first latching means and said second latching means being alternately activated to each other.

In another aspect of the present invention, the semiconductor DRAM comprises:
- a plurality of sense amplifiers arranged in rows and columns;
- a plurality of bit line pairs each comprising a pair of bit lines coupled to each of said sense amplifiers in a column and extended toward opposite row-directions to each other, and an other pair of bit lines coupled to each of the sense amplifiers in an adjacent column and extended toward opposite row-direction to each other, said two pair of bit lines being disposed in parallel to each other, respectively;
- a plurality of word lines arranged perpendicularly to said bit lines;
- a plurality of memory cells each arranged sequentially in each row and column within selected locations of a plurality of spacings formed by intersection of said bit lines and word lines;
- a plurality of latching means each connected with the sense amplifiers arranged in a same column; and
- a plurality of dummy bit lines arranged in parallel with each of left and right outermost bit lines.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE PREFERRED EMBODIMENT

Figure 2:
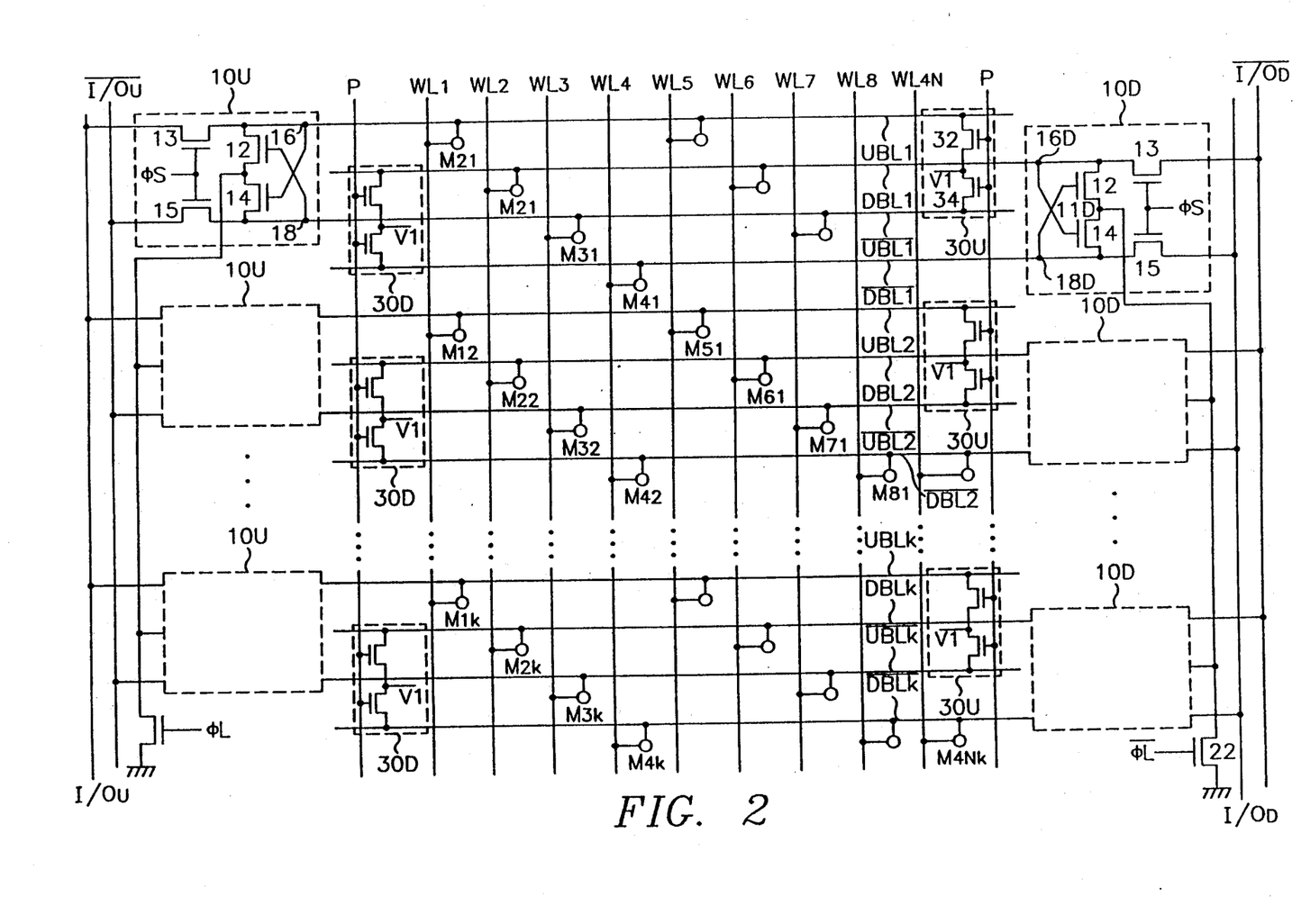
FIG. 2 illustrates the circuit of a folded bit line DRAM according to the present invention.

Referring to FIG. 2, on the upper end of the circuit are a plurality of upper sense amplifiers 10U arranged in a row, while on the lower end are a plurality of lower sense amplifiers 10D arranged in a row. Each of the sense amplifiers comprises MOS transistors 12-15. Drains of the MOS transistors 12 and 14 are cross-connected with their gates through sensing nodes 16, 18, while sources of the transistors 12, 14 are connected with a source common node 11. Between the drains of the MOS transistors 12, 14 and the input/output lines I/OU, $\overline{I/OU}$ and I/OD, $\overline{I/OD}$ are respectively connected the source-drain paths of load MOS transistors 13, 15, while to the gates of the MOS transistors 13, 15 is applied the load signal $\phi$s.

The source common nodes 11 of the sense amplifirs 10U are connected with the upper common line 24 connected with the drain of the MOS transistor 20 for driving the upper sense amplifiers 10U. The source of the MOS transistor 20 is grounded, and the gate of the transistor 20 receives the signal $\phi$L to activate the upper sense amplifer. The sensing nodes 16 and 18 of the upper sense amplifiers 10U are respectively connected with the upper bit line (or column line) pairs UBL1 and $\overline{UBL2}$, UBL1 and $\overline{UBL2}$, ... UBLK and $\overline{UBLK}$ extending to the lower direction. The end of the bit line pairs opposite to the sense amplifiers 10U is connected with the precharging means 30U for precharging the bit lines. The precharging means 30U comprises MOS transistors 32 and 34, the sources of which are respectively connected with the bit line pairs, and the drains of which are connected with a constant precharging voltage V1, and the gates of which are connected with the precharging signal P.

The source common node 11D of the lower sense amplifiers 10D having the same construction as the upper sense amplifiers 10U is connected with the drain of the MOS transistor 22 for driving the lower sense amplifiers 10D through the lower common line 26. The source and the gate of the MOS transistor 22 are respectively connected with the ground and the signal $\overline{\phi L}$ having the opposite characteristic to the signal $\phi$L. Hence, if the upper sense amplifiers 10U are operated by the signal $\phi$L, the lower sense amplifiers 10D are not operated, or vice versa.

The sensing nodes 16D and 18D of the lower sense amplifiers 10D are respectively connected with the lower bit lines DBL1 and $\overline{DBL1}$ ... DBLK and $\overline{DBLK}$ extending to the upper direction, arranged equidistantly between the upper bit lines UBL1 and $\overline{UBL1}$ ... UBLK and $\overline{UBLK}$. The end of the lower bit line pairs DBL1 and $\overline{DBL1}$ ... DBLK and $\overline{DBLK}$ opposite to the lower sense amplifiers 10D is connected with a precharging means 30D having the same construction as the precharging means 30U. Between the precharging means 30U and 30D are arranged parallel word lines (or row lines) WL1-WL4N intersecting perpendicularly the bit lines UBL1 and $\overline{DBL1}$ ... UBLK and $\overline{DBLK}$. With in every fourth intersecting spacing in the directions of rows and columns of the word and the bit lines are sequentially connected the memory cells M11-M4NK, respectively.

Before reading the data from a given memory cell, all the bit lines UBL1-DBLK are precharged with the precharge voltage V1 by the precharging means 30U and 30D. Completing the precharging operation, the word line is chosen in order to read out the data from a given memory cell. For example, the word line WL1 will be chosen to read the data from the memory cell M12. If the word line WL1 is chosen, the memory cells M11-M1K connected with the word line WL1 are chosen, and the charges stored into the storage capacitors of the memory cells M11-M1K are respectively transferred to the bit lines UBL1, UBL2, ... UBLK. Hence, the bit lines UBL1, UBL2, ... UBLK have the voltage somewhat higher or lower than the precharge voltage V1 due to the state of the received charges. Thereafter, if the signal $\phi$L is applied to the gate of the MOS transistor 20, the upper sense amplifiers 10U are activated. If the signal $\phi$S is applied to the gates of the MOS transistors 13, 15, the bit line voltage of a pair of the bit lines UBL1, UBL2 ... $\overline{UBLK}$ and $\overline{UBL1}$, UBL2 ... $\overline{UBLK}$ is transferred to the input/output lines I/O and $\overline{I/O}$. However, the lower sense amplifiers 10D are not activated due to the off state of the MOS transistor 22 whose gate receives the signal $\overline{\phi L}$ having the opposite characteristic to the signal $\phi$L. Thus, the lower bit lines DBL1 and $\overline{DBL1}$, ... DBLK and $\overline{DBLK}$ connected with the lower sense amplifiers 10D maintain the constant value of the precharge voltage V1. Hence, even if the sensing operation of the upper sense amplifiers 10U causes the upper bit lines UBL1 and $\overline{UBL1}$, ... UBLK and $\overline{UBLK}$ to change their voltage, there can be reduced considerably a danger to misread the data due to the coupling capacitance between each of the upper bit lines and its adjacent lower bit lines. Although heretofore is described a case that the upper sense amplifiers are operated by selecting an odd numbered word line, the similar result is obtained by selecting an even numbered word line.

Figure 3:
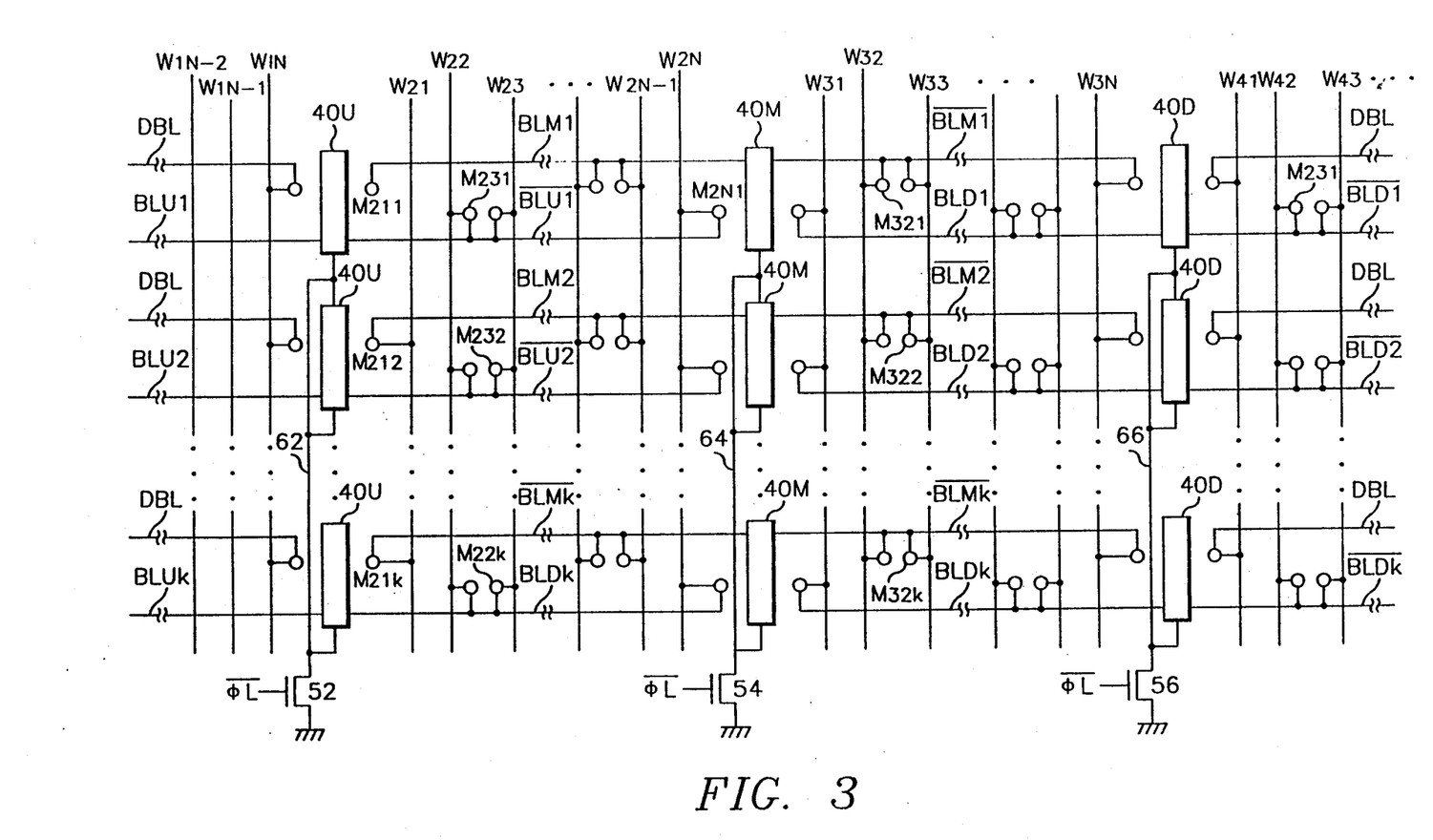
FIG. 3 illustrates the circuit of an open bit line DRAM according to the present invention.

Referring to FIG. 3 showing a circuit according to the open bit line arrangement in DRAM, the sense amplifiers 40U, 40M, 40D all have the same construction as the sense amplifier 10U of FIG. 2. The sense amplifiers 40U, 40M, 40D are equidistantly arranged in their respective columns. The sense amplifiers 40U, 40M, 40D are respectively connected, through lines 62, 64, 66 connected with the common source nodes 11, with drains of the MOS transistors 52, 54, 56 whose sources are grounded. The gate of the MOS transistor 54 is connected with the signal $\phi$L to activate the sense amplifiers 40M, while the gates of the MOS transistors 52, 56 are connected with the signal $\overline{\phi L}$ having the opposite characteristic to the signal $\phi$L. Hence, if the sense amplifiers 40M are activated, the adjacent sense amplifiers 40U, 40D are not activated, or vice versa. The sensing nodes of the sense amplifiers 40M are respectively connected with the bit line pairs BLM1 and $\overline{BLM1}$ ... BLMK and $\overline{BLMK}$ of the same length extended oppositely to each other. Likewise, the sensing nodes of the sense amplifiers 40U, 40D are respectively connected with the bit line pairs BLU1 and $\overline{BLU1}$ ...

BLUK and $\overline{\text{BLUK}}$ and BLD1 and BLD1 ... BLDK and $\overline{\text{BLDK}}$ of the same length as the bit lines $\overline{\text{BLM1}}$ and BLM1 ... BLMK and $\overline{\text{BLMK}}$ extended oppositely to each other. Bit line groups each [BLUK, $\overline{\text{BLUK}}$] and [BLM1, $\overline{\text{BLD}}$ ... BLUK, $\overline{\text{BLDK}}$] are equidistantly arranged in parallel with each other. Moreover, the dummy bit lines DBL are arranged equidistantly in parallel with the bit line groups [BLU1-BLUK] and [BLD1-BLDK] and supplied with a constant precharge voltage to reduce the capacitance coupling with their adjacent bit lines. The end of each bit line opposite to the sense amplifier is connected with the precharging means (not shown) for precharging the bit line with a given voltage. As shown in FIG. 3, memory cells are each connected between the intersecting points of the word lines [ ... W1N, W21-W2N, W31-W3N, W41 ... ] and the bit lines. Namely, the memory cells are arranged so that all the bit lines connected with one of the sense amplifiers 40U, 40M, 40D can access the data in the memory cells if one word line is selected.

For example, it is assumed that the word line W32 is selected after all the bit lines are precharged. Then, the charges stored into the memory cells M321-M32K are transferred to the bit lines BLM1-BLMK. Thereafter, the signal $\phi$L causes the MOS transistor 54 to be switched on, and the sense amplifiers 40M to perform the sensing operation. At this time, the sense amplifiers 40U, 40D adjacent to the sense amplifiers 40M are not activated by the signal $\phi$L having the opposite characteristic to the signal $\phi$L. Thus, the bit lines BLD1-BLDK adjacent to the bit lines $\overline{\text{BLM1-BLMK}}$ are at stand-by state, namely, respectively constant with the precharge voltage, thereby reducing undesirable effect that the data is misread due to the coupling capacitance during the sensing operation.

As described above, when any one bit line of the bit line pair connected with each sense amplifier is leveled down or up according to the sensing operation of the sense amplifier, the present invention has the adjacent bit line be on stand-by state, so that the coupling effect with the adjacent bit line will be reduced to provide a stable sensing operation.

While the invention has been particularly shown and described with reference to a preferred embodiment, it will be understood by those skilled in the art that modifications in detail may be made without departing from the spirit and scope of the invention.

What is claimed is:

1. A semiconductor dynamic random access memory, comprising:
    a plurality of bit lines arranged in parallel to each other for providing a plurality of even numbered bit line pairs and a plurality of odd numbered bit line pairs;
    a plurality of word lines intersecting said plurality of bit lines;
    a plurality of upper sense amplifiers respectively connected to lowermost ends of each of even numbered bit line pairs;
    a plurality of lower sense amplifiers respectively connected to lowermost ends of each of even numbered bit line pairs;
    a memory cell array having a plurality of memory cells arranged sequentially in a diagonal line within selected locations of a plurality of spacings formed by intersection of said bit lines and word lines, said memory cell being disposed at every fourth spacing in a row and a column;
    first latching means connected with said upper sense amplifiers, for activating said upper sense amplifiers; and
    second latching means connected with said lower sense amplifiers, for activating said upper sense amplifiers, said first latching means and said second latching means being alternatively activated to each other.

2. A semiconductor memory as claimed in claim 1, further comprising at least one precharging circuit for precharging said bit line in each of said odd numbered bit line pairs and even numbered bit line pairs.

3. A semiconductor memory as claimed in claim 2, wherein each of said memory cells comprises one transistor and one capacitor.

4. A semiconductor memory, comprising:
    a plurality of sense amplifiers arranged in a plurality of rows and columns;
    a first plurality of bit line pairs wherein each pair of bit lines coupled to each of said sense amplifiers in a first column and extended from each of said sense amplifiers in opposite directions, and a second plurality of bit line pairs wherein each pair of bit lines coupled to each of said sense amplifiers in an adjacent column to said first column, and extended from each of said sense amplifiers in opposite directions, wherein said two pair of bit lines being disposed in parallel to each other, respectively;
    a plurality of word lines arranged perpendicularly to said bit lines;
    a plurality of memory cells wherein each of said memory cells is arranged sequentially in each of said rows and columns within selected locations of a plurality of spacings formed by intersection of said bit lines and word lines;
    a plurality of latching means wherein each latching means is connected in common to the sense amplifiers arranged in respective column; and
    a plurality of dummy bit lines arranged in parallel with one bit line of said pair of bit lines of the selected bit line pairs.

5. A semiconductor memory as claimed in claim 4, wherein said memory cell comprises one transistor and one capacitor.

6. A semiconductor memory as claimed in claim 4, wherein said dummy bit lines are supplied with a constant voltage.

7. A semiconductor memory, comprising:
    a plurality of bit lines arranged in parallel to each other for providing a plurality of even numbered bit line pairs and a plurality of odd numbered bit line pairs;
    a plurality of word lines intersecting said plurality of bit lines;
    a plurality of memory cells wherein each of said memory cells is arranged at selected positions between intersections of each of the bit lines and word lines to couple with the bit line and the word line passing through the intersections respectively;
    a plurality of sense amplifiers connected to a plurality of odd numbered bit line pairs; and
    a plurality of sense amplifiers connected to a plurality of even numbered bit line pairs;
    whereby said odd numbered bit line pairs and said even numbered bit line pairs are alternatively activated to each other.

8. A semiconductor memory as claimed in claim 7, wherein each of said memory cells is selected by activating the connecting a word line so that the corresponding sense amplifier can be activated.

9. A semiconductor dynamic random access memory device as claimed in claim 7, further comprising at least one precharging circuit for precharging said bit line in each of said odd numbered bit line pairs and even numbered bit line pairs.

10. A semiconductor dynamic random access memory device as claimed in claim 7, wherein each of said memory cells comprises one transistor and one capacitor.

11. A semiconductor dynamic random access memory device as claimed in claim 7, further comprising latching means for supplying power to alternately activate the sense amplifiers connecting to the odd numbered bit line pairs or the even numbered bit line pairs for accessing the memory cell.

12. A semiconductor dynamic random access memory, comprising:
a plurality of sense amplifiers arranged in a plurality of rows and columns;
a first plurality of bit line pairs wherein each bit line pair is coupled to each of said sense amplifiers in a first column, and extended from each of said sense amplifiers in opposite directions;
a second plurality of bit line pairs wherein each bit line pair coupled to each of said sense amplifiers in an adjacent column to said first column, and extended from each of said sense amplifiers in opposite directions, wherein the bit line pair from said first plurality of bit line pairs and the bit line pair from said second plurality of bit line pairs are respectively disposed in parallel to each other;
a plurality of word lines arranged perpendicularly to said plurality of bit lines;
a plurality of memory cells wherein each of said memory cells is arranged sequentially in each of said rows and columns within selected locations of a plurality of spacings formed by intersection of said bit lines and word lines;
a plurality of latching means wherein each latching means is connected in common to the sense amplifiers in a respective column for alternatively providing load signals to said sense amplifiers for activating said sense amplifiers to access to a selected memory cell in said plurality of memory cells; and
a plurality of dummy bit lines arranged in parallel with one bit line of said pair of bit lines of the selected bit line pairs for supplying a constant precharge voltage.

13. A semiconductor dynamic random access memory device as claimed in claim 12, further comprising at least one precharging circuit for precharging said bit line with a given voltage at the end of each bit line.

14. A semiconductor dynamic random access memory device as claimed in claim 2, wherein each of said memory cells comprises one transistor and one capacitor.

* * * * *

UNITED STATES PATENT AND TRADEMARK OFFICE
CERTIFICATE OF CORRECTION

PATENT NO. : 5,111,434
DATED : 5 May 1992
INVENTOR(S) : Soo-In CHO

It is certified that error appears in the above-identified patent and that said Letters Patent is hereby corrected as shown below:

On the title page, item (73) Assignee, change "Ltd. Samsung Electronics Co." --Samsung Electronics Co., Ltd.--.

Claim 4, Column 6, Line 19, change "wherein" to --with--;

Line 20, insert --of said first plurality of bit line pairs-- after "lines";

Line 21, insert --of said plurality of columns --- after "column", change "extended"to --extending--, change ", and" to --:--;

Line 23, insert --of bit line pairs-- after "plurality", change "wherein" to --with--, insert --in said second plurality of bit line pairs being-- after "lines";

Line 24, delete "an adjacent";

Line 25, change "column" to --second columns adjacent-- change --extended" to --extending--;

Line 27, change "being" to --in said first and second pluralities of bit line pairs are--;

Line 29, insert --with each word line-- after "lines", insert --each bit of line-- after "to";

Line 30, insert --first and second pluralities of-- after "said", change "lines" to --line pairs--;

Line 31, delete "wherein each of the said";

UNITED STATES PATENT AND TRADEMARK OFFICE
CERTIFICATE OF CORRECTION

PATENT NO. : 5,111,434
DATED : 5 May 1992
INVENTOR(S) : Soo-In CHO

It is certified that error appears in the above-identified patent and that said Letters Patent is hereby corrected as shown below:

IN THE CLAIMS

Claim 4, Column 6, Line 32, delete "memory cells is", delete "in each of";

Line 33, delete "said rows and columns";

Line 35, change "lines", first occurance, to --line--, change "lines", second occurance, to --line of said pluralities of bit line pairs--;

Line 36, change "wherein" to --with--, insert --of said-- after "each";

Line 37, change "is" to --being--, insert --a plurality of-- after "to";

Line 38, change "respective column" to --different corresponding columns--;

Line 40, change "pair" to --bit line pair from said second plurality of bit line pairs--, delete "of bit lines of the se"; and Line 41, delete "lected bit line pairs".

Claim 7, Column 6, Line 57, insert --bit line and word line-- after "each", change "the" to --said plurality of--;

Line 58, change "to couple with the bit line and the word" to --and coupled to--;

Line 59, change "line" to --corresponding ones of said plurality of word lines--; and Line 66, insert --with respect-- after "activated".

UNITED STATES PATENT AND TRADEMARK OFFICE
CERTIFICATE OF CORRECTION

PATENT NO. : 5,111,434

DATED : 5 May 1992

INVENTOR(S) : Soo-In CHO

It is certified that error appears in the above-identified patent and that said Letters Patent is hereby corrected as shown below:

IN THE CLAIMS

Claim 8, Column 6, Line 68, change "selected" to --accessed--;

Column 7, Line 1, change "the connecting word line so that the corre" to --a corresponding sense amplifiers to a selected word line from said plurality of word lines--; and, Line 2, delete "sponding sense amplifier can be activated".

Claim 9, Column 7, Line 3, delete "dynamic random access";

Line 4, delete "device";

Line 5, delete "said bit line in"; and

Line 6, insert --bit line-- after "each".

Claim 10, Column 7, Line 10, change "transistor" to --capacitor--, insert --only-- after "and", change "capaci" to --transistor--; and, Line 11, delete "tor".

Claim 11, Column 7, Line 16, change "or" to --and--; and

Line 17, change "the" to --a selected--.

Claim 12, Column 7, Line 23, change "is" to --in said first plurality of bit line pairs being--;

Line 22, change "wherein" to a comma --,-- ;

Line 24, delete the comma",", change "extended" to --extending--;

Line 26, change "wherein" to --,-- a comma;

UNITED STATES PATENT AND TRADEMARK OFFICE
CERTIFICATE OF CORRECTION

PATENT NO. : 5,111,434

DATED : 5 May 1992

INVENTOR(S) : Soo-In CHO

It is certified that error appears in the above-identified patent and that said Letters Patent is hereby corrected as shown below:

IN THE CLAIMS

Claim 12, Column 7, Line 27, insert --in said second plurality being-- after "pair";

Line 28, change "an adjacent column" to --second columns adjacent--, delete "ex";

Line 29, change "tended" to --extending--;

Line 30, change "the" to --said--;

Column 8, Line 1, change "the" to --said--;

Line 2, delete "respectively";

Line 5, change "plurality" to --first and second plurality-- change "lines" to --line pairs--;

Line 6, change "wherein" to a comma --,--;

Line 7, change "is" to --being--, change "each" to --corresponding ones--;

Line 11, change "wherein" to a comma --,--, insert --of said-- after "each";

Line 12, change "is" to --being--, change "the" to --said plurality of--;

Line 13, change "a respective" to --each corresponding--, insert a comma --,-- after "column";

Line 15, delete "to a";

Line 16, change "cell in" to --cells among--;

UNITED STATES PATENT AND TRADEMARK OFFICE
CERTIFICATE OF CORRECTION

PATENT NO. : 5,111,434
DATED : 5 May 1992
INVENTOR(S) : Soo-In CHO

It is certified that error appears in the above-identified patent and that said Letters Patent is hereby corrected as shown below:

IN THE CLAIMS

Claim 12, Column 8, Line 18, change "pair of bit lines of the se" to --bit line pair from said second plurality of bit line pairs--; and Line 19, delete "lected bit line pairs", change "supplying" to --storing--.

Claim 13, Column 8, Line 22, delete "device";

Line 23, insert --operatively connected to the end of each bit line of said bit line pair from said first plurality of bit line pair-- after "circuit"; and Line 24, change "given" to --predetermined--, delete "at the end of each bit line".

Claim 14, Column 8, Line 27, change "transistor" to --capacitor--, insert --only-- after "and", change "capaci" to --transistor-- ; and Line 28, delete "tor".

Claim 1, column 5, line 58, change "even" to --odd--.
Claim 4, column 6, line 19, change "wherein" to --with--.

UNITED STATES PATENT AND TRADEMARK OFFICE
CERTIFICATE OF CORRECTION

PATENT NO. : 5,111,434
DATED : 5 May 1992
INVENTOR(S) : Soo-In CHO

It is certified that error appears in the above-identified patent and that said Letters Patent is hereby corrected as shown below:

Claim 4, column 6, line 19, change "wherein" to --with--.

Signed and Sealed this

Fifth Day of April, 1994

Attest:

BRUCE LEHMAN

Attesting Officer

Commissioner of Patents and Trademarks